US006700191B2

(12) United States Patent
Schmid et al.

(10) Patent No.: US 6,700,191 B2
(45) Date of Patent: Mar. 2, 2004

(54) ELECTRONIC POWER CIRCUIT OF SEVERAL POWER MODULES

(75) Inventors: Ralf Schmid, Kaltental (DE); Marco Schmidt, Landsberg (DE); Johann Sontheim, Andechs (DE); Helmut Perkounigg, Weilheim (DE)

(73) Assignee: Continental ISAD Electronic Systems GmbH & Co. OHG, Landsberg (DE)

( * ) Notice: Subject to any disclaimer, the term of this patent is extended or adjusted under 35 U.S.C. 154(b) by 0 days.

(21) Appl. No.: 10/102,900

(22) Filed: Mar. 22, 2002

(65) Prior Publication Data

US 2002/0137399 A1 Sep. 26, 2002

(30) Foreign Application Priority Data

Mar. 22, 2001 (DE) .......................................... 101 14 125

(51) Int. Cl.[7] .............................................. H01L 23/52
(52) U.S. Cl. ...................................... 257/691; 257/777
(58) Field of Search ........................... 439/69; 257/691, 257/686, 777

(56) References Cited

U.S. PATENT DOCUMENTS 5,053,852 A * 10/1991 Biswas et al.
5,270,492 A * 12/1993 Fukui .......................... 361/777
5,581,118 A * 12/1996 Mays .......................... 257/666
5,835,358 A * 11/1998 Brakus ........................ 361/791
6,424,030 B2 * 7/2002 Masayuki et al. ........... 257/777

FOREIGN PATENT DOCUMENTS

DE    199 13 450         9/2000
JP    56-88345         * 7/1981

OTHER PUBLICATIONS

IBM Technical Bulletin, Vol 16; No. 5; p. 1610, Oct. 1973.*

* cited by examiner

Primary Examiner—Neil Abrams
(74) Attorney, Agent, or Firm—Walter Ottesen

(57) ABSTRACT

An electronic power circuit includes several power modules (1) and is especially for controlling an electrical machine. Each power module (1) includes a plate-shaped integrated electronic circuit arrangement (2) having several electrical terminals. A perpendicular bent-over electrically conducting side leg (3) is arranged on each of two opposite-lying sides of the plate-shaped circuit arrangement (2). The side leg (3) forms an electrical contact and, in this way, the power module (1) has a U-shaped cross section. Each side leg (3) is provided with connecting elements via which two or several power modules (1) can be electrically and mechanically fixedly connected to each other while forming a mutual spacing between the plate-shaped circuit arrangement (2) via the side legs (3) for forming the electronic power circuit.

15 Claims, 3 Drawing Sheets

ELECTRONIC POWER CIRCUIT OF SEVERAL POWER MODULES

BACKGROUND OF THE INVENTION

Two aspects are important in the configuration of electronic power circuits comprising several power modules. On the one hand, the method steps for manufacturing the electronic power circuits must be able to be carried out with ever greater efficiency and must have an ever higher degree of automatization. On the other hand, ever greater requirements are imposed on the reliability and usability while at the same time taking up minimal space and volume.

The electronic power circuits are especially used for controlling electric machines and for generating electrical energy. The generated electrical energy is made available to the most varied consumers which are usually connected in an electrical network. Such electrical networks are used, for example, as on-board networks for vehicles. Especially when an electrical machine is used in a vehicle, only a small space for accommodating components is usually available.

U.S. Pat. No. 6,326,761 discloses a power electronic device for controlling an electrical machine. The power electronic device includes a power component which has a plurality of condensers and a plurality of power semiconductors which are connected to a power rail. Furthermore, a cooling device is provided which is so connected to the condensers and/or the power semiconductors that a thermal exchange takes place or can take place between these condensers and semiconductors and the cooling device. Several power semiconductors are arranged one next to the other by means of a clamping connection directly on the surface of the cooling device through which a cooling liquid flows. The thermal exchange between the power semiconductors and the cooling liquid takes place via the metal surface of the cooling device.

It is disadvantageous here that the power semiconductors lie directly on the surface of the cooling device or are disposed in the same plane therewith. For this reason, the power semiconductors must be electrically insulated from the cooling device. An electrically insulating surface is arranged between the power semiconductors and the cooling device. This surface, however, restricts the free thermal exchange between the power semiconductors and the cooling device. The dilemma here is in the selection of a good electrical insulation or a direct thermal exchange.

SUMMARY OF THE INVENTION

It is an object of the invention to provide a power circuit of the kind described initially herein which is characterized by a clearly simplified and more compact configuration and permits an improved thermal exchange and can be manufactured simply and substantially automatically.

The electronic power circuit of the invention includes: a plurality of power modules; each one of the power modules including a plate-shaped integrated electronic circuit unit and first and second perpendicularly bent-over electrically conducting side legs defining respective electrical terminals and being disposed on opposite-lying sides of the circuit unit thereby imparting a U-shaped cross section to the power module; the plurality of power modules being stacked one atop the other with each two mutually adjacent ones of the electronic circuit units conjointly defining a space or distance therebetween; and, the side legs of one of two mutually adjacent ones of the circuit units and the corresponding ones of the side legs of the other one of the two mutually adjacent ones of the circuit units conjointly defining connecting means for facilitating an electrically and mechanically fixed connection of the power modules one to the other to form the electronic power circuit.

In the invention, each power module includes a plate-shaped integrated electronic circuit unit having several electrical terminals. According to the invention, a perpendicularly bent-over electric conducting side leg is arranged on each of the two opposite-lying ends of the plate-shaped circuit unit. These bent-over electric conducting side legs define an electrical connection. In this way, the power module has a U-shaped cross section. Each side leg is provided with connecting means via which two or more power modules are electrically and mechanically fixedly connected to each other to form the electronic power circuit. Each two of the power modules form a common spacing between the plate-shaped circuit arrangements.

The power circuit according to the invention is characterized by the arrangement and configuration of the individual power modules. They can advantageously be stacked one atop the other in the form of a tower.

A compact power circuit requiring little space is achieved with the arrangement of the individual power modules. With the power modules built up in accordance with the invention, an electronic power circuit adapted to different requirements can be produced quickly and with flexibility.

In addition, the power circuit according to the invention is characterized by a very simple configuration which is also easy to manufacture. A power circuit of this kind can be manufactured substantially with automatization.

Waste heat occurs during operation of the power circuit which has to be conducted away because the power circuit would otherwise become damaged. In total, the power circuit according to the invention is characterized by an improved removal of heat. The configuration of the power module in accordance with the invention is especially suitable for a cooling by air for which the otherwise conventional and complex apparative cooling means connections are unnecessary.

The space delimited by the side legs of a power module defines a cooling channel wherein a cooling medium can be supplied to and conducted away. The cooling medium can, for example, be a boiling medium utilized for cooling. The cooling medium is in direct thermal contact with the power modules so that a direct thermal exchange between cooling medium and the power module takes place and the waste heat is conducted away.

Furthermore, and compared to the conventional state of the art, fewer parts are needed for building up the power circuit. This leads to an advantageous reduction of weight.

A further advantage lies in the especially excellent stiffness of the power circuit which is brought about by the spatial three-dimensional configuration of the power module.

The power modules can, for example, be power semiconductors such as MOSFETs, IGBTs or the like. The selection of the suitable power semiconductors is made in accordance with the power requirements placed on the power circuit. If the power circuit is to be used, for example, in the context of a 42 V on-board network of a motor vehicle, then MOSFETs are suitable. In contrast, IGBTs are used at still higher voltages.

According to a further embodiment, the side leg has a projection below the bend which projects toward the outside and runs parallel to the bending line. On this projection, a further side leg can be inserted with its lower end. In this way, the side legs which are inserted one on the other partially overlap.

In this way, a prefixing of the power modules to the electronic circuit is achieved. These power modules are pushed one upon the other and are to be connected. The projection forms a centering aid for the automated stacking, the so-called packaging of the power modules to so-called stacks, that is, to a stack-shaped configuration.

Preferably, the side leg has at least one cutout in the bend with a lip arranged therein and, on the lower side, at least one cutout which forms the precise-fit counterpart to the lip.

In this way, the stacked modules can also be prefixed.

Alternatively, it is provided that the side leg, at its lower side, has at least one cutout having an inwardly bent lip arranged therein and, in the bend, a cutout forming the precise-fit counterpart to the lip.

When stacking a power module on another, the inwardly bent lip of the side leg of the one power module latches into the cutout of the other power module. A prefixing of this kind provides a stabilizing action on the total configuration of the power circuit.

Thereafter, the side legs, which are arranged one on the other, are electrically conductively connected via a welding process or soldering process and especially via a resistance welding process.

The side legs are joined with such a welding or soldering process and are therefore electrically conductively connected to each other.

Furthermore, the side legs are so configured that at least one electrical component, especially a capacitor, can be introduced into the space delimited by the side legs.

In this way, a simple space-saving arrangement of the electrical components is possible without it being necessary to change the dimensions of the power circuit.

An arrangement of an electrical component of this kind also affords the advantage that a cooling of the component is thereby ensured. The electrical component is disposed in the cooling channel and is therefore in direct thermal contact with the cooling air. In this way, the waste heat, which arises during operation of the electrical component, can be conducted away.

The configuration of the power circuit is very dependent upon the required voltage level. For this reason, the number of electrical components such as capacitors and the number of the power modules vary depending upon the configuration of the power circuit. The power circuit can be adapted to the desired conditions and the power can be scaled especially because of the modular configuration.

In a further advantageous embodiment of the invention, the component has two lateral electrical contact rails which can be connected to the region of the side legs above the bend in such a manner that the component is arranged over the plate-shaped circuit arrangement.

A simple cooling of the circuit arrangement and of the electrical component is achieved via the arrangement of the electrical component at a spacing to the circuit arrangement. The electrical component need not be electrically insulated relative to the circuit arrangement.

Elevated portions are preferably provided on the side legs above the bend for the connection to the contact rail via projection welding.

A further embodiment provides that the side legs can be connected to another electrical component, to a current supply network and/or to a consumer.

Preferably, the circuit arrangement is embedded in a plastic, especially, in epoxy resin or gel. This plastic serves as an insulating material and should exhibit very good resistance to temperature as well as thermal conductivity.

In a further embodiment, electrical contacts, especially power and signal contacts are provided on at least one of the legless ends of the circuit arrangement.

Furthermore, the side legs are provided with electrically conductive connecting pins at least at one transverse end for soldering to a circuit board.

Furthermore, the side legs can be configured on at least one transverse end with an electric contact for connecting to a current rail.

Finally, at least one power module according to the invention is used in a power electronic device for the control of an asynchronous machine known per se which is a primary part of a crankshaft starter generator (KSG).

A crankshaft starter generator is a combination of a starter and a generator and, if necessary, also a vibration damper. With a crankshaft starter generator of this kind, the higher energy requirement of future vehicle generations, which is expected by the automotive industry, can be covered, for example, by a three-fold increase of the present-day battery voltage of 14 Volts to 42 Volts. This is achieved with an asynchronous electric motor which is flange connected directly to the crankshaft as an electromechanical actuating member of the crankshaft starter generator system. It replaces the fly wheel, which up to now has been conventional, and needs only insignificantly more space.

The power modules of the power circuit according to the invention are mounted so that they save space so that a crankshaft starter generator system can be integrated into existing drive trains with little complexity. The efficient cooling of the power module permits a compact configuration.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
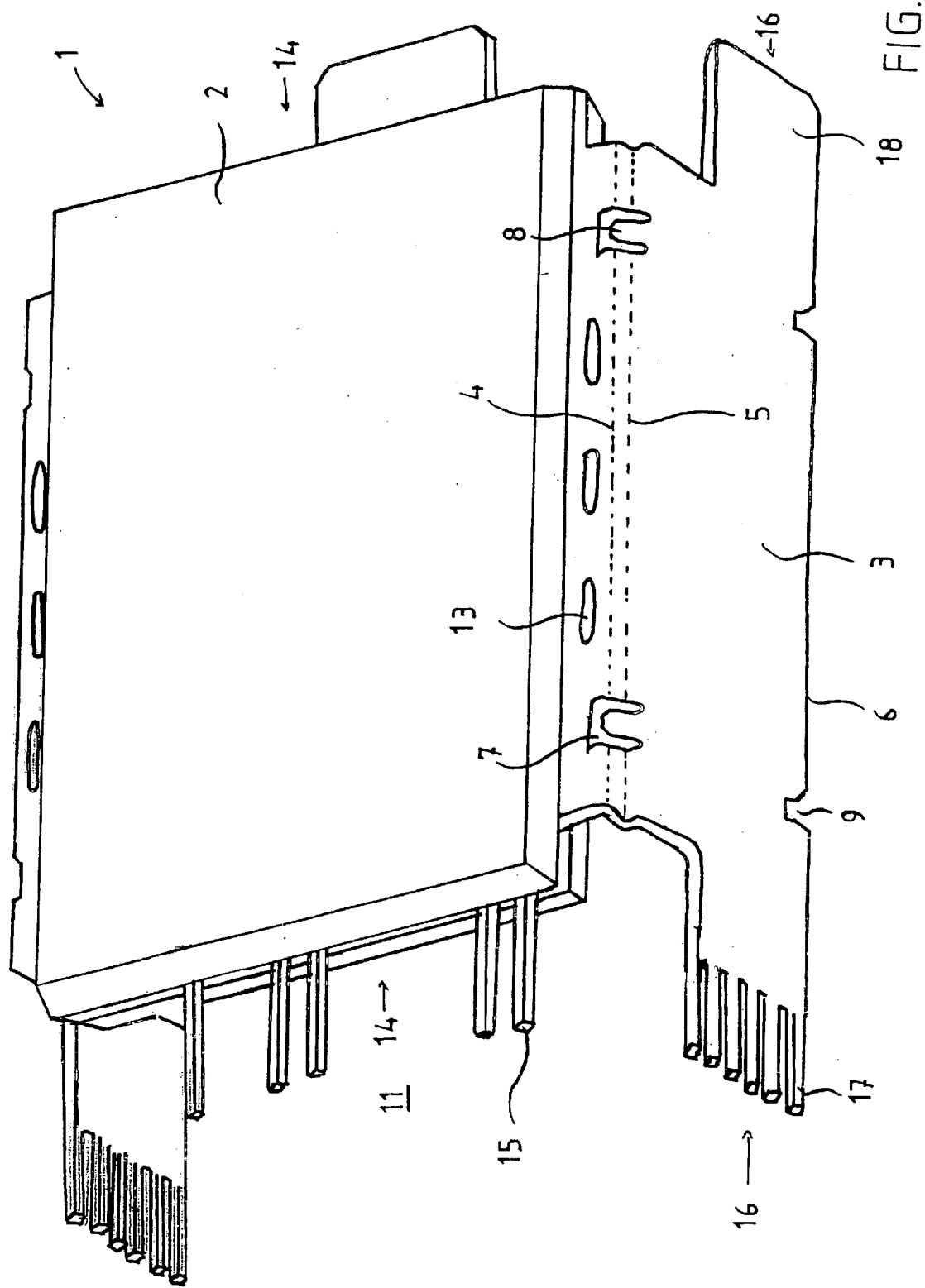
FIG. 1 is a perspective view of a power module according to an embodiment of the invention.

FIG. 1 is a perspective view of the power module 1 of the invention. The power module 1 comprises a plate-shaped integrated electronic circuit arrangement 2 having several electrical terminals 15. According to the invention, a perpendicular bent-over electrically conducting side leg 3 is arranged on two mutually opposite ends of the plate-shaped circuit arrangement 2. The side legs 3 define an electrical connection.

Below a bend 4, the side legs 3 have a projection 5 which projects outwardly and extends parallel to the bending line. A further side leg 3 can, with the lower end 6, be plugged into the projection 5.

The side leg 3 has two cutouts 7 in the bend 4 and each cutout 7 has a lip 8 formed therein and, on the lower end 6, the side leg has two cutouts 9 defining the precise-fit counterparts to the lips 8.

Furthermore, above the bend 4, protrusions 13 are arranged on the side legs 3. These protrusions are provided for a projection welding via which the power module 1 can be joined to an electrical component such as a capacitor.

Electrical contacts 15, especially power and signal contacts, are arranged on a legless end 14 of the circuit arrangement 2. On one end 16, the side legs 3 are formed with electrically-conducting connecting pins 17 for soldering to a circuit board (not shown). On the opposite-lying end 16 of the side legs 3, an electrical contact 18 is provided for connecting to a current rail (not shown).

Figure 2:
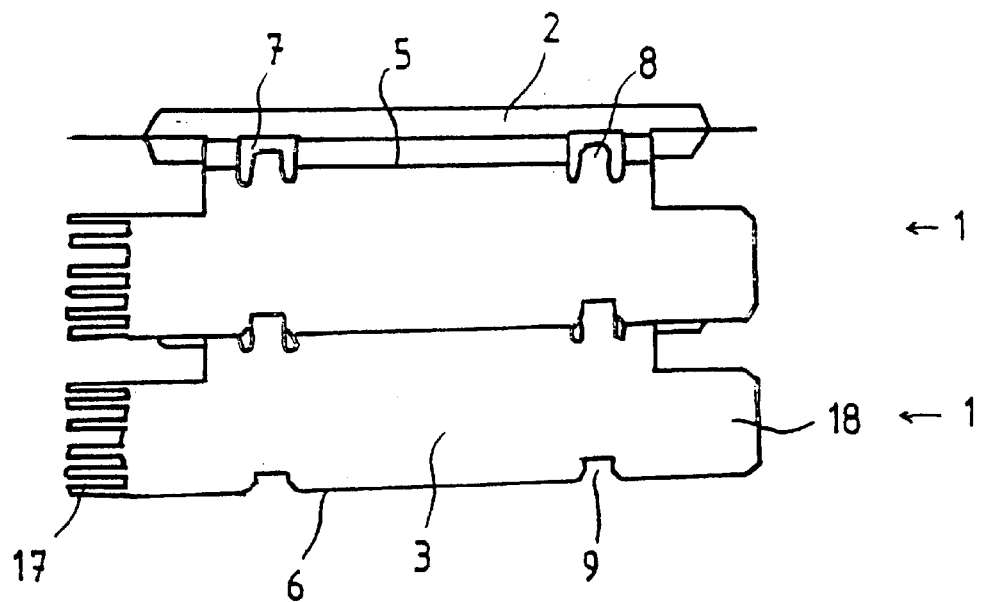
FIG. 2 is a side elevation view of two power modules stacked one atop the other.

FIG. 2 shows a side elevation view of two power modules 1 plug connected one into the other. A surprisingly simple configuration is shown which is also simple to manufacture.

In FIG. 2, the side legs 3 of the upper power module 1 are plugged into the projection 5 of the side legs 3 of the lower power module 1 with the projection 5 standing so as to be offset outwardly. The side legs 3, which are plugged one into the other, partially overlap.

In this way, a prefixing is achieved of the mutually stacked power modules 1 which are to be connected to an electronic power circuit. The projection 5 defines a centering aid for the automated stacking or so-called packaging of the power modules 1 to so-called stacks.

The side legs furthermore include two cutouts 7 in the bend and each cutout 7 includes a lip 8 mounted therein and, at the lower end 6, a cutout 9 is provided defining the precise-fit counterpart to the lip 8. In this way, the mutually stacked 5 power modules 1 can also be prefixed. A lateral slippage of the stacked power modules 1 is prevented.

Thereafter, the side legs 3, which are arranged one atop the other, are connected by a welding or soldering process and are therefore mechanically and electrically connected.

The electrically conducting connecting pins 17 are formed on a transverse end of the side leg 3 and are provided for soldering onto a circuit board (not shown) and the electric contacts 18 are for connecting to a current rail (not shown).

Figure 3:
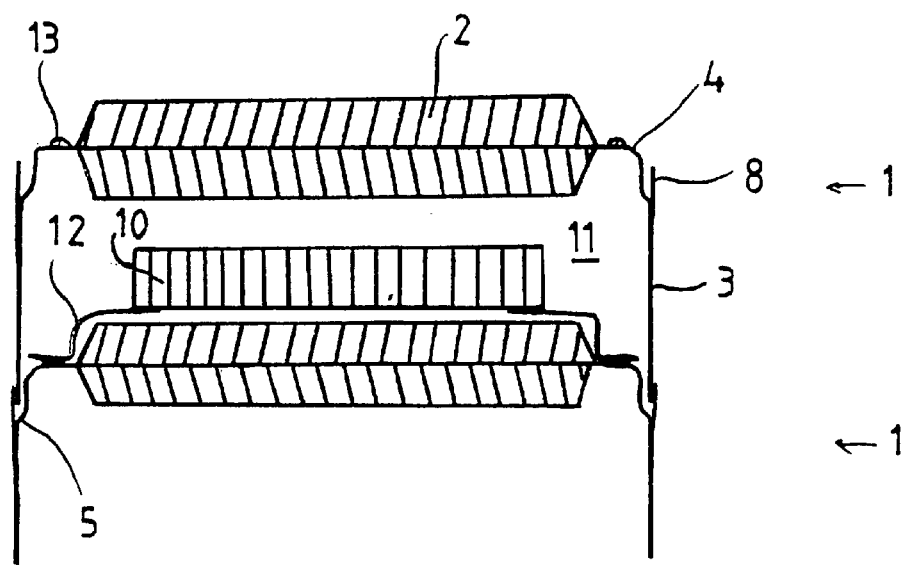
FIG. 3 is a cross-section view of two power modules stacked one atop the other; and, FIG. 4 is a detail section view of the side leg of a power module according to the invention.

FIG. 3 shows a schematic cross section of two stacked power modules one plugged into the other.

Each power module 1 includes a plate-shaped circuit arrangement 2. A perpendicular bent-over electrically conducting side leg 3 is arranged on two opposite-lying ends of the plate-shaped circuit arrangement 2 whereby the power module 1 has a U-shaped cross section. The power modules 1 are plugged one into the other via the side legs 3 to form the electronic power circuit but are not yet fixedly connected to each other. The two power modules 1 conjointly define a space between the plate-shaped circuit arrangements 2.

Each side leg 3 has, below the bend 4, an outwardly offset projection 5 running parallel to the bending line. In FIG. 3, the lower ends of the side legs 3 of the upper power module 1 are plugged into the projection 5 of the side leg 3 of the lower power module 1. For the sake of clarity, the direct contact engagement of the side legs 3 on the corresponding projection 5 is only indicated. The mutually plugged-in side legs 3 partially overlap as shown in FIG. 3. Furthermore, each side leg 3 has, in the bend 4, at least one cutout (not shown) with a lip 8 arranged therein and, at the lower end, at least one cutout (not shown) forming the precise-fit counterpart to the lip 8.

With the projections 5 as well as with the cutouts and lips 8, a prefixing of the stacked power modules 1 to be connected to an electronic power circuit is achieved. Thereafter, the mutually stacked side legs 3 are electrically and mechanically joined to each other by an automated welding or soldering process.

Furthermore, an electrical component 10, for example, a capacitor, is introduced into the space 11 delimited by the side legs 3. The electric component 10 includes two lateral electric contact rails 12 which are connected to the region of the side legs 3 lying above the bend 4 with this connection being achieved with projection welding. For this purpose, protrusions 13 are arranged on the side leg 3 above the bend 4.

It is noted that the waste heat, which arises during operation of the power circuit, can be easily conducted away. The configuration of the power module 1 of the invention is especially suitable for air cooling so that the otherwise conventional complex cooling means connections are unnecessary.

The space 11 delimited by the side legs 3 of a power module 1 forms a cooling channel in which cooling air can be supplied and conducted away. The cooling air is in direct thermal contact with the power module 1 so that a direct thermal exchange between the cooling air and the power module 1 takes place and the waste heat is conducted away.

The arrangement according to the invention of the electrical component 10 is also advantageous because this component is located directly in the cooling channel and therefore is in direct thermal contact with the cooling air. In this way, the waste heat, which arises during operation of the electrical component 10, can be conducted away.

A simple cooling of the circuit arrangement 2 and of the electrical component 10 is achieved with the arrangement of the electrical component 10 at a spacing to the circuit arrangement 2. The electrical component 10 must therefore not be electrically insulated relative to the circuit arrangement 2.

Figure 4:
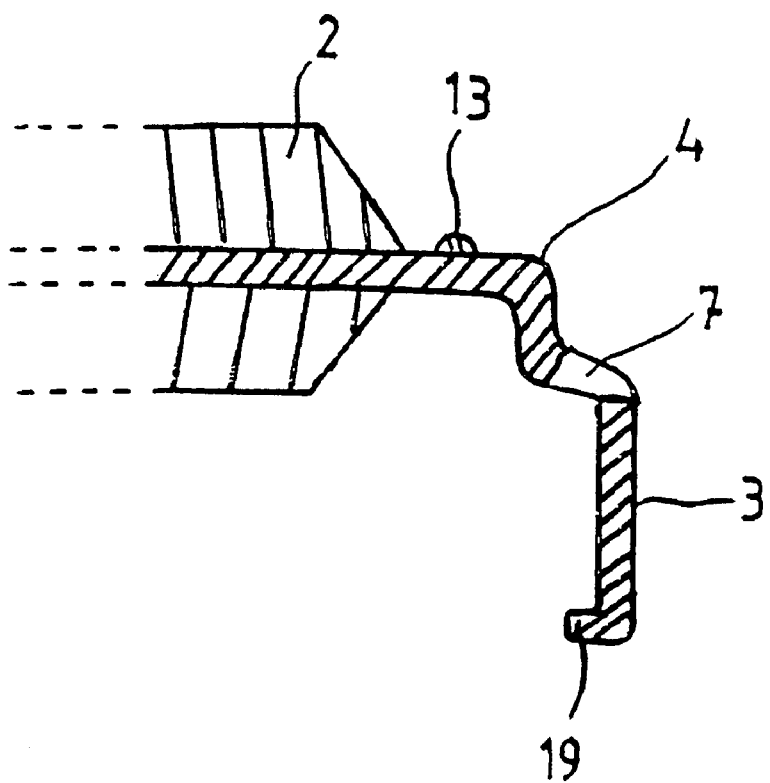

FIG. 4 shows a cross section detail view of an alternatively configured side leg 3 of a power module 1 according to the invention.

A side leg 3 configured in this manner includes a lip 19 bent inwardly at the lower end and a cutout 7 in the bend 4. The cutout 7 defines the precise-fit counter piece to the lip 19.

When inserting a power module 1 into another power module, the inwardly bent lip 19 of the side leg 3 of the power module 1 latches into the cutout 7 of the other power module 1. A prefixing of this kind imparts a stabilizing effect to the total configuration of the power circuit.

Also, a protrusion 13, which is arranged above the bend 4, is shown for the projection welding. The circuit arrangement 2 is only indicated.

It is understood that the invention is not limited to the above description and embodiments shown in FIGS. 1 to 4. More than two power modules and other electrical components can form the electronic circuit arrangement.

It is understood that the foregoing description is that of the preferred embodiments of the invention and that various changes and modifications may be made thereto without departing from the spirit and scope of the invention as defined in the appended claims.

What is claimed is:

1. An electronic power circuit comprising:

a plurality of power modules;

each one of said power modules including a plate-shaped integrated electronic circuit unit and first and second perpendicularly bent over electrically conducting side legs defining respective electrical terminals and being disposed on opposite-lying sides of said circuit unit thereby imparting a U-shaped cross section to said power module;

said plurality of power modules being stacked one atop the other with each two mutually adjacent ones of said electronic circuit units conjointly defining a space or distance therebetween;

the side legs of one of two mutually adjacent ones of said circuit units and the corresponding ones of the side legs of the other one of said two mutually adjacent ones of said circuit units conjointly defining connecting means for facilitating an electrically and mechanically fixed connection of said power modules one to the other to form said electronic power circuit;

each of said side legs having a bend whereat said side legs are bent over and said bend defining a bending line;

each of said side legs having an outwardly extending projection extending parallel to said bending line; each of said side legs having a lower end; and, the lower ends of the side legs of one circuit unit are inserted or plugged into the respective projections of the side legs of the next adjacent circuit unit so as to partially overlap and so define said connecting means.

2. The electronic power circuit of claim 1, wherein each of said side legs has a first cutout formed in said bend and a lip disposed in said first cutout; a second cutout is formed in the lower end of the side leg; and, said second cutout of the one leg of the one circuit unit is a precise fit counterpart for the lip of the corresponding leg of the next adjacent circuit unit.

3. The electronic power circuit of claim 1, wherein each of said side legs has a first cutout formed in said lower end thereof and an inwardly bent lip disposed in said first cutout; a second cutout formed in said bend; and, said second cutout of the one leg of the one circuit unit is a precise fit counterpart for the lip of the corresponding leg of the next adjacent circuit unit.

4. The electronic power circuit of claim 1, wherein the side legs of one of two mutually adjacent ones of said circuit units and the corresponding ones of the side legs of the other one of said two mutually adjacent ones of said circuit units are joined by a welding or soldering process so as to be electricallly conductively connected.

5. The electronic power circuit of claim 4, wherein said welding process is a resistance welding process.

6. The electronic power circuit of claim 1, wherein said side legs conjointly define a space therebetween and wherein said electronic power circuit further comprises an electrical component arranged in said space.

7. The electronic power circuit of claim 1, wherein said electrical component is a capacitor.

8. The electronic power circuit of claim 7, wherein said electrical component has two lateral electrical contact rails which are so connectable to the side legs above said bend so that said electrical component is arranged above the plate-shaped integrated electronic circuit unit.

9. The electronic power circuit of claim 1, wherein each one of said side legs has raised portions above the bend thereof for connecting to said contact rails via a projection weld.

10. The electronic power circuit of claims 1, wherein said side rails can be electrically connected to at least one of:
other electrical components, a current supply network and an electrical consumer.

11. The electronic power circuit of claim 1, wherein said plate-shaped integrated electronic circuit unit is embedded in plastic.

12. The electronic power circuit of claim 11, wherein said plastic includes epoxy resin or gel.

13. The electronic power circuit of claim 1, wherein at least one of said plate-shaped integrated electronic circuit units has electrical contacts at a longitudinal end thereof and said electrical contacts include power contacts and signal contacts.

14. The electronic power circuit of claim 1, wherein at least one of said side legs has electrically conducting connecting pins at a longitudinal end thereof for soldering to a printed circuit board.

15. The electronic power circuit of claim 1, wherein at least one of said side legs has an electrical contact at a longitudinal end thereof for connecting to a current rail.

* * * * *